United States Patent [19]
Gulla et al.

[11] Patent Number: 5,158,860
[45] Date of Patent: Oct. 27, 1992

[54] SELECTIVE METALLIZATION PROCESS

[75] Inventors: Michael Gulla; Prasit Sricharoenchaikit, both of Millis, Mass.

[73] Assignee: Shipley Company Inc., Newton, Mass.

[21] Appl. No.: 607,711

[22] Filed: Nov. 1, 1990

[51] Int. Cl.[5] .................................................. G03C 5/58
[52] U.S. Cl. ..................................... 430/315; 430/319; 430/328; 427/304; 427/305
[58] Field of Search ............... 430/311, 313, 315, 319, 430/328, 317; 427/304, 305

[56] References Cited

U.S. PATENT DOCUMENTS

| | | | |
|---|---|---|---|
| 4,388,351 | 6/1983 | Sawyer | 427/304 |
| 4,526,810 | 7/1985 | Nesbitt | 430/315 |
| 4,748,104 | 5/1988 | Ferrier et al. | 430/315 |
| 4,827,326 | 5/1989 | Altman et al. | 430/317 |
| 4,906,552 | 3/1990 | Ngo et al. | 430/315 |
| 4,981,715 | 1/1991 | Hirsch et al. | 427/53.1 |

*Primary Examiner*—Marion E. McCamish
*Assistant Examiner*—Kathleen Duda
*Attorney, Agent, or Firm*—Robert L. Goldberg

[57] ABSTRACT

A process for selective metallization comprising the steps of providing a substrate coated with a photoresist, imaging the photoresist coating by exposure to pattern radiation and development, flood exposing the photoresist coating to activating radiation, depositing an electroless plating catalyst over the entire imaged photoresist coating and bared underlying substrate, removing the top surface of the flood exposed, catalyzed photoresist coating by development whereby plating catalyst remains in a desired selective pattern and depositing metal over the catalyzed surface to form a metal deposit in a selective pattern such as in a circuit pattern. The process is suitable for the manufacture of diverse articles including printed circuit boards.

23 Claims, 1 Drawing Sheet

SELECTIVE METALLIZATION PROCESS

BACKGROUND OF THE INVENTION

1. Introduction

This invention relates to a method for selective metal deposition. More particularly this invention relates to a method for depositing metal onto a substrate in a pattern such as lines and spaces as required for the fabrication of electronic circuits. The invention is especially useful for formation of microelectronic circuits having submicron dimensional features.

2. Description of the Prior Art

Electronic circuits comprise an array of conductive lines and spaces over an insulating substrate such as a plastic or ceramic. There are many methods for the manufacture of electronic circuits. A conventional method for making circuits comprises the formation of printed circuit boards by a subtractive process. In the subtractive process, typically a planar plastic substrate having copper foil cladding on both of its surfaces is drilled to provide openings passing between the surfaces. The walls of the openings are subsequently metallized, typically by an electroless metal deposition process whereby there is provided conductive pathways electrically connecting the two surfaces of the circuit board. Thereafter, a photosensitive organic coating is coated over the copper foil cladding. Ultraviolet exposure followed by development produces a desired imaged pattern of traces and alternating with spaces. Exposed copper in the spaces may then be reinforced with electrolytic copper and subsequently solder or another dissimilar metal or organic etch resist is then coated onto all exposed copper surfaces. The organic coating is selectively removed and the copper exposed by removal of the organic coating is etched with a chemical etchant to provide a conductive circuit pattern on the plastic substrate. The circuit board manufactured by this method comprises a circuit having lines and spaces typically of a width of several mils.

Another method for formation of a circuit board is known in the art as an additive process. In this process, an unclad substrate is drilled to provide openings between surfaces. Thereafter, the entire surface of the substrate is prepared for metal plating by immersion in an electroless plating catalyst solution such as a palladium tin colloid catalyst as disclosed in U.S. Pat. No. 3,011,920. Following catalysis, an organic coating in an image pattern of lines and spaces is provided on the entire surface of the plastic substrate. By providing recesses within the organic coating, plating catalyst is exposed and available to initiate a metal deposition reaction. The substrate is then immersed in an electroless metal plating solution for a time sufficient to metallize to a full desired thickness. Thereafter, the organic coating may be removed if desired and catalyst exposed by the removal of the organic coating may be removed by contact with a suitable stripper. Though methods for formation of additive circuits have been known for many years, most circuits are made by the subtractive process due to the unsuitability of metal plating solutions capable of providing adequate thick deposits of metal having suitable metallurgical properties within a reasonable acceptable period of time. Boards produced by this method have lines and spaces of a width at least comparable to the line widths obtained by subtractive processes and often exceeding that possible by subtractive methods due to elimination of undercut during an etching step.

Another method for formation of circuits is known in the art as a semi-additive method and is designed to minimize a limitation in resolution caused by undercutting. In this method, a board is provided with a thin clad copper coating which can then be built up by conventional plating procedures. The semi-additive method is essentially a combination of the subtractive and additive methods. Each of the methods is described by Coombs, *Printed Circuits Handbook*, McGraw-Hill Book Company, New York, 2nd Ed., 20-3 to 23-19, 1979, incorporated herein by reference.

There is a desire in the industry to provide circuits of lines and spaces of finer dimension than those possible or obtainable by the methods described above. For example, in printed circuit board manufacture, it is desirable to reduce lines and space widths to one mil or less. This desire is discussed by R.D. Rust, "Fine Line Technology, The Impact of Dry Plasma Processing," *P.C. Fab.*, June 1987, pp. 37-44. For formation of circuit patterns over ceramics or silicon based substrates, such as in the formation of integrated circuits, it is desirable to reduce line width and spaces to one micron or less.

An example of an effort to obtain fine line image resolution over a nonconductive or semiconductive substrate is disclosed by Kenji et al, Japan Kokai Tokyo Koho J.P. 62,250,177 [87,250,177] Oct. 31, 1987, application 86/92,536,22, April 1986. In this method, a fine metal pattern is formed on an electrically insulating or semiconductive substrate by selective deposition in an electroless coating bath containing sodium hypophosphite as a reducing agent. The substrate is precoated with a catalytic pattern before dipping into the bath. Thus, a palladium coated polyimide board is capable of masking with a resist pattern and dipping in a bath containing nickel sulfate, a source of tungsten ions and a hypophosphite reducing agent to provide a fine image pattern of nickel-tungsten-phosphorous alloy.

SUMMARY OF THE INVENTION

The subject invention provides a method for formation of selective metal deposits over essentially any solid substrate. The method of the invention is especially suitable for fabrication of high-density circuit boards with line widths of 3 mils or less and integrated circuits with line widths of 1 micron or less.

The method of the invention utilizes the fine line geometries obtainable using high contrast photoresists and a new process of selective metallization. The process steps of the invention are set forth below for a process using a positive working photoresist:

a. provide a substrate prepared for coating with a photoresist;

b. apply a photoresist coating over the substrate and form a desired image in said photoresist coating such as by exposure to pattern radiation followed by wet or dry development;

and then in either order:

c. flood expose the photoresist coating to activating radiation;

d. deposit an electroless plating catalyst over the entire imaged photoresist coating whereby all surfaces of the coating and bared underlying substrates are catalyzed;

and then:

e. remove the top surface of the flood exposed, catalyzed photoresist coating by surface development whereby plating catalyst remains in a desired selective pattern; and f. deposit metal over the catalyzed surface to form a metal deposit in a selective pattern such as in a circuit pattern.

In the above process, the exposure and formation of an image in the photoresist coating (Step b) provides a relief image over the underlying substrate. The dimensions of the lines within the image are limited only by the resolution capability of the photoresist. It is known in the art that photoresists may be processed to yield submicron images—i.e., images of 0.25 microns. Partial flood exposure of the photoresist coating (Step d), especially using collimated light and surface imaging techniques renders the photoresist soluble in a developer in light exposed areas. Caution should be exercised to prevent exposure through the entire coating as only the surface is to be removed by development. The step of catalysis (Step d) results in electroless plating catalyst adsorbed on all surfaces in contact with the catalyst including the top and sidewalls of the photoresist relief image and the substrate exposed by development of the photoresist. Steps c and d may be reversed if desired but the sequence given above is preferred. Thereafter, contact of the surface exposed photoresist coating with a suitable developer that does not strip or deactivate catalyst from unexposed areas (Step e) will remove the top surface of the photoresist thereby removing catalyst from the top surface of the coating, but not from areas of the photoresist not exposed to flood exposure or the underlying substrate. Following the development step, there remains an adsorbed coating of catalyst in a selective pattern which may be treated with an accelerator and metallized in a selective pattern conforming to the pattern of the remaining catalyst adsorbed on the surface of the part (Step f). For this reason, contact of the so treated substrate with an electroless plating solution results in metal deposition in a desired selective pattern where the geometry of the deposit is defined by the patterned catalytic surface remaining on the photoresist coating sidewalls and underlying substrate.

In a lesser preferred embodiment of the invention, a negative acting photoresist is used, catalysis (Step d) would precede Step c and Step c would comprise brief contact with a reactive ion etch through a properly imaged photomask or a wash with a solvent for the resist remaining following development to remove the catalyst adsorbed thereon.

DESCRIPTION OF THE PREFERRED EMBODIMENTS

Figure 1:
FIGS. 1, 2, 3, 4A, 4B, 5A, 5B, 6 and 7 illustrate successive steps in the fabrication of a selective metal deposit on a substrate such as a circuit board substrate practicing one embodiment of the invention utilizing a positive working photoresist.

The principal materials required for the process of the invention include a substrate over which metal is to be selectively deposited, photoresist and electroless metal plating chemicals including a plating catalyst and an electroless plating solution. All of the materials required to practice the process of the invention are known to the art.

In accordance with the invention, the substrate over which metal is to be deposited may be permanent or temporary. A permanent substrate may comprise any of a known number of desired structures. For example, the substrate may be a conventional printed circuit board, a molded circuit board, a hybrid circuit, a ceramic, a housing for an item of electronic equipment, etc. In one embodiment of the invention, the substrate may be an existing surface and the process of the invention may be used to form a multilayered circuit configuration. Another substrate may be an unclad plastic where multiple additive circuits may be sequentially built into a stack of circuits. Other materials and configurations would be obvious to those skilled in the art.

Suitable photoresists for the process of the invention include those photoresists known to the art such as those described in numerous publications including DeForest, *Photoresist Materials and Processes*, McGraw-Hill Book Company, New York, Ch. 2, 1975 and Moreau, *Semiconductor Lithography, Principles, Practices and Materials*, Plenum Press, New York, Chs. 2 and 4, 1988, incorporated herein by reference.

Positive working photoresists typically are two component systems comprising a light sensitive compound in a film forming binder where the light sensitive component undergoes photochemical alteration upon exposure. The two component system may be dissolved in a suitable solvent to make a coating composition. Single component system photoresists are known and typically comprise a polymer then undergo chain scission upon exposure. The light sensitive compounds most frequently used in two component resist systems are esters and amides formed from o-quinone diazide sulfonic and carboxylic acids, especially from sulfonic acid esters of naphthoquinone diazides. These esters and amides are well known and described by DeForest, supra, pages 47–55 and by Moreau, supra, pages 34–52. The light sensitive compounds and the methods used to make the same are all documented in prior patents including U.S. Pat. Nos. 3,046,110; 3,046,112; 3,046,119; 3,046,121; 3,106,465; 4,596,763; and 4,588,677, all incorporated herein by reference.

The polymer binders most frequently used for positive working photoresists using o-quinone diazide sensitizers are the alkali soluble phenol formaldehyde resins known as the novolak resins. Photoresists using such polymers are illustrated in U.S. Pat. Nos. 4,377,631 and 4,404,272. Another class of binders used with o-quinone diazides are homopolymers and copolymers of vinyl phenol. Photoresists of this nature are disclosed in U.S. Pat. No. 3,869,292.

Single component photoresists comprise a polymer that undergoes chain scission. A photoresist using a polyglutarimide polymer as a binder alone or in combination with a photoactive component is disclosed in U.S. Pat. No. 4,246,374 and further in U.S. Pat. No. 4,636,532. A photoresist using polymethylmethacrylate as a single component system is disclosed in U.S. Pat. No. 4,584,309. Polyester and polyketone resists that are single component positive resists are disclosed in U.S. Pat. No. 4,584,309.

Negative acting photoresists are also suitable for purposes of the invention but lesser preferred. A preferred class of such photoresists are the acid hardening resists disclosed in EPO application No. 0 232 972 which comprise an acid hardening resin, an aminoplast or phenoplast and a halogenated, organic, photoacid generating compound. Another preferred class of photoresists are those disclosed and claimed in U.S. Pat. No. 4,877,818 incorporated herein by reference. These resists comprise at least one polymer having charged carrier groups, a photoinitiator and a source of unsaturation for crosslinking a film upon exposure to activating radiation.

The materials required for metal deposition include an electroless plating catalyst, usually an accelerator and an electroless metal plating solution. Catalysis involves deposition of a material that is catalytic to electroless metal deposition onto the surface of a substrate to be plated. The process of catalysis comprises contact of the substrate, typically by immersion, with an aqueous solution of the catalyst for a time sufficient to adsorb an adequate amount of catalyst onto the surface. Immersion times generally vary from about 30 seconds to 10 minutes in a solution varying in temperature from about room temperature to about 50° C. or higher.

Catalyst compositions for electroless metal deposition are known to those skilled in the art and are disclosed in U.S. Pat. No. 3,011,920, incorporated herein by reference. The method of this patent comprises catalyzing a substrate by treatment with a bath containing colloidal particles formed by reducing a catalytic metal with tin. The catalytic metal is typically a precious metal and is most often palladium. The oxidation product of the tin salt is believed to form a protective colloid. Numerous improvements have been made in this process and in the composition of the colloidal catalyst bath as disclosed in, for example, U.S. Pat. Nos. 3,719,508; 3,728,137; 3,977,884; and 4,725,314. With respect to U.S. Pat. No. 4,725,314, there is described preparation of catalyst particles of dimensions not exceeding 500 angstroms (0.05 microns). For purposes of this invention, plating catalyst having particles of small dimension are preferred.

As is known in the art, following catalysis and prior to electroless metal deposition, it is desirable to treat the catalyzed surface with an accelerator. A preferred method for acceleration in accordance with this invention comprises contact of the catalyzed surface with a dilute solution of a dissolved noble metal, preferably palladium dissolved in dilute hydrochloric acid solution. The use of such a solution results in substantial improvement in line acuity following metal deposition and is especially desired where fine-line geometries are desired. A solution containing from about 0.01 to 5.0 weight percent of a salt of the noble metal is suitable, and preferably from about 0.1 to 2.0 weight percent.

Electroless metal deposition solutions are those that deposit metal over a catalytically active surface by chemical reduction in the absence of an external electric current. Processes and compositions for electroless metal deposition are known in the art and are in substantial commercial use. They are disclosed in a number of prior art patents, for example, copper plating solutions are disclosed in U.S. Pat. Nos. 3,615,732; 3,615,733; 3,728,137; 3,846,138; 4,229,218; and 4,453,904, all incorporated herein by reference. Electroless nickel plating solutions are described in U.S. Pat. Nos. 2,690,401; 2,690,402; 2,762,723; 3,420,680; 3,515,564; and 4,467,067, all incorporated herein by reference. A large number of copper and nickel plating solutions are commercially available. Other metals that may be electrolessly deposited include gold, palladium, cobalt and tin-lead alloys. The preferred electroless metals for purposes of this invention are copper and nickel. Preferably, the nickel plating solution is used at full strength and at an elevated temperature of between 50° and 85° C. but below a temperature detrimental to the photoresist.

Known electroless metal deposition solutions generally comprise four ingredients dissolved in water. They are (1) a source of metal ions, usually a metal salt such as copper or nickel sulfate, (2) a reducing agent such as formaldehyde or a borane for copper solutions or hypophosphite or a borane for nickel solutions, (3) a pH adjustor such as hydroxide or acid dependent upon the metal plating solution and (4) one or more complexing agents for the metal sufficient to prevent its precipitation from solution. Other additives are typically contained in such plating solutions such as stabilizers, exaltants, etc.

The invention will be better understood by reference to FIGS. 1 through 7 which depict process steps suitable for fabrication of a printed circuit board using the process of the invention with a positive acting photoresist.

In FIG. 1, there is shown a substrate 10 coated with a photoresist layer 11. The substrate 10 may be of any material suitable for metallization. A typical substrate would be an epoxy unclad circuit board material. The photoresist layer 11 may be of any of the materials described above and is applied in conventional manner such as by whirl coating, roller coating, dry film application, etc. The thickness of the photoresist layer is dependent upon the substrate and the desired finished product and may vary between about 0.1 and 100 microns and preferably varies between about 0.5 and 50 microns.

Figure 2:
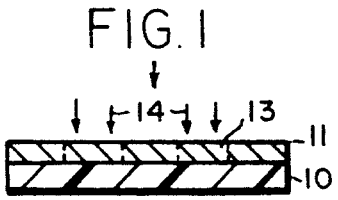

Following formation of a dry photoresist coating 11 over substrate 10, the next step in the process involves imaging the dry photoresist layer as illustrated in FIG. 2 of the drawings. Imaging comprises exposure of the photoresist coating to a source of actinic radiation through a mask 12 having a desired image pattern. The image may be in a negative or positive pattern dependent upon whether the photoresist is a positive or negative acting photoresist as should be apparent to those skilled in the art. The required exposure dose and wavelength is dependent upon the spectral sensitivity of the photoresist used. Typically, exposure is to a source of monochromatic (single wavelength) radiation within a wavelength of from about 190 to 465 nm at an exposure dose varying between about 10 and 1,000 mJ/cm$^2$, but may also be x-ray, excimer laser, etc. The exposure of the photoresist layer through mask 12 results in formation of a latent image in photoresist layer 11 represented by numeral 13 in FIG. 2.

Figure 3:

The next step in the process, shown in FIG. 3 of the drawings, comprises development of the exposed photoresist layer 11 with a liquid developer suitable for the photoresist used. Developers for photoresists are well known in the art and the citations of references showing photoresists identify developers used in combination with the described photoresists. Contact of the developer with the imaged photoresist layer results in removal of latent image 13 and replacement of the same with recesses 14. The development step exposes substrate 10 where development removed the photoresist to form recesses 14.

Figure 4A:
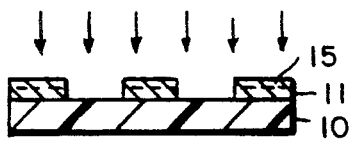

The subsequent steps in the process result in the formation of a catalytic layer in a selective pattern suitable for metallization. The steps used to form a selective pattern involve catalysis, partial flood exposure and surface development. The sequence may comprise partial flood exposure followed by catalysis (FIGS. 4A and 5A) followed by partial development or may be reversed to comprise catalysis followed by flood exposure (FIGS. 4B and 5B) followed by partial development. With reference to the drawings, FIG. 4A shows flood exposure of the substrate 10 coated with photoresist layer 11 imaged to provide recesses 14. The step of partial flood exposure of the photoresist to activating radiation is similar to the exposure step utilized to form a latent image in photoresist layer 11 but a mask is not required since all surfaces are exposed. Dosage is preferably significantly reduced below the level used for complete exposure of the resist as only the surface area of the photoresist coating need be exposed. In general, dosage may be as low as from 5 to 25 percent of the dosage required for full exposure. Therefore, while in conventional processes, exposure dosage is sufficient to expose the photoresist coating through its full thickness, in the process of the subject invention, exposure of only the top surface of the photoresist coating is adequate to form surface imaged layer 15 as shown in FIG. 4A. Surface imaging procedures are known in the art. Therefore, broadly stated, the exposure dose for purposes of this step is preferably substantially less than that required to form a latent image throughout the full thickness of a photoresist coating because only the top surface of the photoresist coating need be exposed though full thickness exposure may be used if desired. Caution should be used in determining the optimum dose. For conventional positive working photoresists comprising a diazo compound and a novolak resin, an exposure dose of from about 25 to 50 mJ/cm$^2$ has been found to be suitable.

Figure 5A:
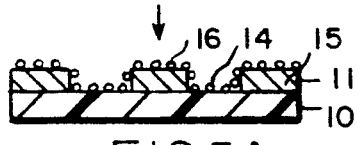

Following flood exposure, the next step in the process, illustrated in FIG. 5A of the drawings, involves catalysis of all surfaces (photoresist top surface and sidewalls and exposed underlying substrate) with plating catalyst 16. The process of catalysis comprises contact, typically by immersion, of the substrate coated with the photoresist layer with an aqueous solution of a plating catalyst for a time sufficient to adsorb an adequate amount of catalyst on all surfaces. Immersion time generally varies from about 30 seconds to 10 minutes in a solution varying in temperature from about room temperature to 50° C. or higher. It should be noted that the step of catalysis causes adsorption of catalyst 16 on all surfaces including the surfaces of photoresist layer 11 and the exposed surfaces of substrate 10.

Figure 4B:
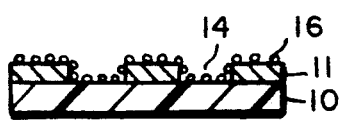
Figure 5B:
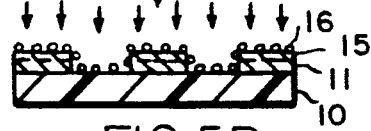

The sequence set forth above for flood exposure and catalysis may be reversed. A sequence of catalysis followed by flood exposure is illustrated in FIGS. 4B and 5B where like parts are designated with like numerals.

Figure 6:
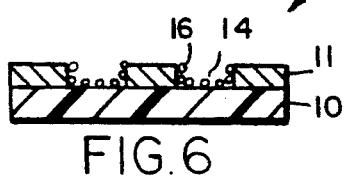

Following exposure, and with reference to FIG. 6 of the drawings, the imaged top surface of the exposed photoresist layer 15 (FIGS. 5A and 5B) is removed by contact with a developer. For the most part, the top surface is removed because this is the surface primarily exposed during the exposure step. The object of the development step is to remove the exposed photoresist surface 15 thereby simultaneously washing away plating catalyst on said top surface resulting in the composite illustrated in FIG. 6 where non-catalyzed surfaces 17 are the top surface of photoresist layer 11 and catalyzed surfaces 16 comprise the side walls of the recesses 14 and the underlying substrate. Caution should be exercised in this step to prevent excessive development that can lead to excessive resist removal with simultaneous removal of catalyst where selective metallization is desired.

Figure 7:
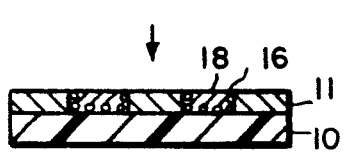

The next step in the process, shown in FIG. 7, comprises electroless deposition of metal onto plating catalyst 16 to form metal deposits 18 corresponding to recesses 14 in size and shape. Plating is by electroless metal deposition and is in accordance with prior art procedures. Plating is preferably conducted until the metal deposits to the full thickness of the photoresist layer 11 or longer if it is desired to have a deposit that spreads above and beyond the recesses in the photoresist coating. If the photoresist is one subject to attack by strong alkali, it may be necessary to plate the metal from a plating solution that is neutral or acidic such as a dimethyl amine borane plating solution. Alternatively, acid nickel plating solutions are suitable. If the photoresist layer 11 is not one subject to attack by highly alkaline solutions, conventional electroless copper plating solutions may be used.

Following the step of plating, if the photoresist layer 11 is one suitable to function as a permanent coating, it may be retained on the surface of the coating. If not, it may be removed and replaced by a suitable dielectric coating (not shown) in accordance with conventional prior art methods.

The invention may also be practiced using a negative acting photoresist. This method is lesser preferred because it does not yield selective metallized deposits with an image resolution equivalent to that obtainable using the positive acting photoresist. The initial process sequence using a negative resist would be the same as that described in FIGS. 1 through 3 and 4B above except that the resist layer 11 would be of a negative acting material and exposure would be through a mask bearing a negative of the desired pattern. The sequence would yield the structure depicted in FIG. 4B comprising substrate 10, the imaged photoresist layer 11 and catalytic layer 16 over the photoresist layer 11 including exposed photoresist layer 11 in recesses 14. The balance of the process sequence is depicted in FIGS. 8 and 9.

Figure 8:
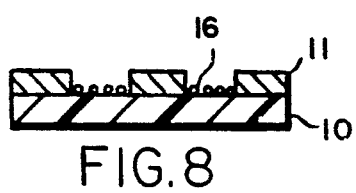
FIGS. 8 and 9 illustrate successive steps in the fabrication of a selective metal deposit on a substrate such as a circuit board substrate practicing an alternative embodiment of the invention utilizing a negative working photoresist.
Figure 9:
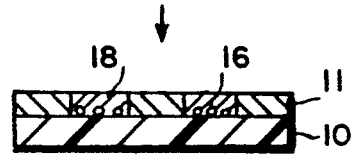

To obtain the structure depicted in FIG. 8, the photoresist layer 11 could be processed by one of several alternative procedures. In one procedure, the photoresist layer is subjected to a brief exposure to reactive ion etching through a mask having a suitable image pattern whereby the surface of the photoresist with overlying catalyst would be ablated leaving catalyst in a selective pattern. In this procedure, it is necessary to carefully control the exposure as excessive contact with the reactive ion etch may remove excessive photoresist. Alternatively, the photoresist is briefly contacted with a photoresist solvent, not a developer, to remove the top surface of the photoresist. The solvent used must be selected to avoid stripping or deactivation of catalyst where metallization is desired. Regardless of the procedure used, much of the catalyst 16 will be removed from the sidewalls of the photoresist leaving catalyst 16 primarily on the exposed underlying substrate. Following selective removal of the photoresist and overlying catalyst, metal is plated over the remaining catalyst in a pattern of desired metallization.

It is an advantage to the process of the invention that the circuit formed following the procedures of FIGS. 1 to 7 comprises fine line metal conductors—e.g., copper or nickel, separated by dielectric coating without catalyst underlying the dielectric coating. In prior art processes for additive circuit formation, often catalyst remains beneath the photoresist layer which if not removed, can provide undesired conductive paths that decrease surface insulation resistance values and which may produce unacceptable shorting out of the circuit during use. In addition, the line widths and spaces between lines are determined by the resolution capability of the photoresist. In this respect, with regard to circuit manufacture, it is possible to provide lines having a width of 3 mils or less. For example, a circuit can be manufactured in accordance with the invention having line widths of 1 mil or less separated by spaces having a width of 2 mils or less. If desired, circuits can be formed on other substrates such as semiconductor substrates having line widths of less than 0.5 microns or greater than 50 microns as desired.

The process described above is suitable for the formation of multilayer printed circuit boards. For such purpose, the finished circuit shown in FIG. 7 could be coated with a suitable dielectric material and imaged to form recesses for interconnections. These openings could then be metal plated using the process of the invention or any other conventional process followed by repetition of the process depicted in FIGS. 1 to 7 of the drawings to form an additional circuit layer.

The invention will be better understood by reference to the example that follows.

A 4 inch diameter silicon wafer was primed with hexamethyldisilazane, then spin-coated with a positive photoresist identified as Microposit ® S1813 photoresist (comprising a naphthoquinone diazide sulfonic acid ester and a novolak resin in a solvent) for 30 seconds at 4500 rpm. Thereafter, wet photoresist coating was dried at 90° C. for 30 minutes to provide a coating having a thickness of 1.2 microns. This coating was exposed to ultraviolet radiation using a GCA DSW wafer stepper to expose successive portions of the coating under conditions known to give full exposure, namely, an energy level of approximately 150 mJ/cm$^2$ with appropriate depth of focus. To form a pattern, the radiation was passed through a GCA resolution reticle mask. The wafer was then developed with Microposit ® developer in a 1:1 dilution for 70 seconds at room temperature to give full development of the exposed portions of the photoresist layer. The developed photoresist image was then flood exposed to the same energy source at an energy level of approximately 35 mJ/cm$^2$. Following flood exposure, the wafer was immersed in an electroless plating precatalyst solution identified as Cataprep 404 ® pretreatment solution for 1 minute at about 30° C. to prepare the surface for adsorption of catalyst. Electroless plating catalyst Cataposit ® 44 colloid was then adsorbed from a 6% solution for 4 minutes at about 49° C. The part was then rinsed with deionized water and again contacted with Microposit ® developer in a 1:1 dilution for 8 seconds at room temperature to remove the top surface of the partially flood exposed resist together with catalyst adsorbed thereon. Electroless nickel was then deposited on the wafer by treatment with Niposit ® 468 electroless nickel at full strength for 60 seconds at a pH of between 7.5 and 7.9 and a temperature of 77° C. to form a nickel deposit in the desired image pattern. No nickel deposited on the top surface of the photoresist layer.

The formation of a patterned deposit of nickel demonstrates the capability of the process to control the areas where electroless nickel will deposit by selective metallization. The nickel deposit was rated by visual observation with a light microscope at 100× magnification with a subjective quality rating of about 9.0 on a scale of from 0 to 10.

We claim:

1. A process for the formation of a metal pattern over a substrate, said process comprising the steps of:
    a. providing a substrate coated with a layer of a light sensitive photoresist;
    b. exposing said photoresist coating to activating radiation in an image pattern to form a latent image followed by development of said latent image to provide an image photoresist coating with portions of the substrate by development to form recesses;
    c. applying an electroless plating catalyst over the image photoresist coating whereby all surfaces, including a top surface, of the coating and bared substrate are catalyzed;
    d. removing the top surface of the image photoresist coating by a process comprising blanket exposure of the imaged photoresist coating to activating radiation where the radiation is at a dose below a level needed for complete exposure of the photoresist and contact with a developer for the photoresist whereby the plating catalyst is removed from the top surface of said coating to form a catalyzed surface; and
    e. depositing metal over the catalyzed surface to form a metal deposit in a selective pattern within the recesses of the imaged photoresist coating.

2. The process of claim 1 where the step of blanket exposure precedes the step of catalysis with an electroless plating catalyst.

3. The process of claim 1 where the step of catalysis with an electroless plating catalyst precedes the step of blanket exposure.

4. The process of claim 1 where the photoresist comprises a naphthoquinone diazo photoactive compound and a novolak resin.

5. The process of claim 1 where the photoresist comprises an aqueous solution or emulsion of a polymer having carrier groups, a photoinitiator and a source of unsaturation for crosslinking the film during exposure.

6. A process for the formation of a metal pattern over a substrate, said process comprising the steps of:
    a. providing a substrate coated with a layer of a positive working light sensitive photoresist;
    b. exposing said photoresist coating to activating radiation in an image pattern to form a latent image and developing said latent image to provide an image photoresist coating with portions of the substrate bared by development to form recesses; and then, in either order:
    c. partial flood exposing the photoresist coating to activating radiation where the radiation is at a dose below a level needed for complete exposure of the photoresist; and
    d. depositing an electroless plating catalyst over the imaged photoresist coating whereby all surfaces, including a top surface, of the coating and bared substrate are catalyzed;
    e. removing the top surface of the photoresist coating by contact with a developer for the photoresist whereby the plating catalyst is removed from said top surface to form a catalyzed surface; and
    f. depositing metal over the catalyzed surface to form a metal deposit in a selective pattern within the recesses of the imaged photoresist coating.

7. The process of claim 6 where the step of flood exposure precedes the step of catalysis with an electroless plating catalyst.

8. The process of claim 6 where the step of catalysis with an electroless plating catalyst precedes the step of flood exposure.

9. The process of claim 6 where the photoresist comprises a naphthoquinone diazo photoactive compound and a novolak resin.

10. The process of claim 6 where the electroless plating catalyst is a noble metal catalyst.

11. The process of claim 10 where the catalyst is a tin-palladium colloid.

12. The process of claim 6 where the plating metal is selected from the group consisting of copper and nickel.

13. The process of claim 12 where the catalyst has an average particle size not exceeding 50 Angstroms.

14. The process of claim 6 where the substrate is a printed circuit board substrate and the line widths of the metal deposit do not exceed 1 mil.

15. The process of claim 6 where the substrate is a semiconductor substrate and the line widths do not exceed 5 microns.

16. A process for the formation of a printed circuit board, said process comprising the steps of:
   a. providing a circuit board substrate coated with a layer of a light sensitive positive acting photoresist;
   b. exposing the photoresist coating to activating radiation to form an image corresponding to a desired circuit and developing said image to form an image photoresist coating with recesses baring the substrate in said pattern;
   c. flood exposing the photoresist coating to activating radiation where the radiation is at a dose below a level needed for complete exposure of the photoresist;
   d. depositing an electroless plating catalyst over all surfaces, including a top surface, of the image photoresist coating and bared substrate;
   e. developing the top surface of the photoresist coating whereby there remains a relief image free of plating catalyst with plating catalyst remaining in a desired circuit pattern forming the catalyzed surface; and
   f. depositing metal over the catalyzed surface to form a metal circuit within the recesses of the relief image.

17. The process of claim 16 where the electroless plating catalyst is a noble metal catalyst.

18. The process of claim 17 where the catalyst is a tin-palladium colloid.

19. The process of claim 16 including a step of acceleration with an acidic solution of a noble metal after catalysis and prior to metallization.

20. The process of claim 16 where the plating metal is nickel.

21. The process of claim 16 including a step of replacing photoresist following metal deposition with an organic dielectric material having a dielectric constant not exceeding 3.5.

22. The process of claim 16 where the substrate is a printed circuit board substrate and the line widths of the metal deposit do not exceed 3 mils.

23. The process of claim 22 where the widths of the metal deposit do not exceed 1 mil.

* * * * *